United States Patent
Liu et al.

(10) Patent No.: US 8,547,366 B2
(45) Date of Patent: Oct. 1, 2013

(54) DRIVING DEVICES FOR PROVIDING DRIVING SIGNALS TO DISPLAY ARRAYS

(75) Inventors: Ping-Lin Liu, Tainan (TW); Tse-Yuan Chen, Fengyuan (TW)

(73) Assignee: Chimei Innolux Corporation, Miao-Li County (TW)

( * ) Notice: Subject to any disclaimer, the term of this patent is extended or adjusted under 35 U.S.C. 154(b) by 476 days.

(21) Appl. No.: 12/785,681

(22) Filed: May 24, 2010

(65) Prior Publication Data

US 2010/0321350 A1  Dec. 23, 2010

(30) Foreign Application Priority Data

May 22, 2009 (TW) .............................. 98117049 A

(51) Int. Cl.
*G09G 5/00* (2006.01)

(52) U.S. Cl.
USPC .......................................... 345/204; 345/100

(58) Field of Classification Search
USPC .......................................... 345/204, 98, 100
See application file for complete search history.

(56) References Cited

U.S. PATENT DOCUMENTS

| | | | | |
|---|---|---|---|---|
| 2003/0218594 A1* | 11/2003 | Ishii | ................................ | 345/96 |
| 2008/0055293 A1* | 3/2008 | Kuo et al. | ..................... | 345/204 |
| 2009/0079713 A1* | 3/2009 | Nagashima | ................... | 345/204 |

* cited by examiner

*Primary Examiner* — Chanh Nguyen
*Assistant Examiner* — Jonathan Blancha
(74) *Attorney, Agent, or Firm* — McClure, Qualey & Rodack, LLP

(57) ABSTRACT

A driving device outputting a plurality of sequentially asserted driving signals is provided, including a shift register, a buffer unit, and switch circuits. The shift register includes shift registering units coupled in series. The shift registering units respectively generate shift registering signals which are sequentially asserted. The buffer unit receives at least one input signal. The input signal is periodically asserted, and the buffer unit outputs the input signal. The switch circuits are coupled to the shift registering units to receive the shift registering signals, respectively. All of the switch circuits are coupled to the buffer unit to receive the input signal, and the switch circuits sequentially output the input signal to serve as the driving signals according to the assertion of the shift registering signals.

18 Claims, 16 Drawing Sheets

DRIVING DEVICES FOR PROVIDING DRIVING SIGNALS TO DISPLAY ARRAYS

CROSS REFERENCE TO RELATED APPLICATIONS

This application claims the benefit of Taiwan application Serial No. 98117049 filed May 22, 2009, the subject matter of which is incorporated herein by reference.

BACKGROUND OF THE INVENTION

1. Field of the Invention

The invention relates to a driving circuit, and more particularly to a driving device for a scan driving device of a display panel.

2. Description of the Related Art

FIG. 1 shows a scan driving device in a conventional display panel. Referring to FIG. 1, a scan driving device 1 outputs driving signals $S_1$-$S_N$ (N is a positive integer) and transmits the driving signals $S_1$-$S_N$ to a display array of the display panel through scan lines. The scan driving device 1 comprises a plurality stages of shift registering units $10_1$-$10_N$ and a plurality of buffering output units $11_1$-$11_N$. Each of the shift registering units $10_1$-$10_N$ comprises switch units 100 and 101 and inverter units 102 and 103, and the switch unit 100 receives a start signal. The shift registering units $10_1$-$10_N$ generate shift registering signals $VSR_1$-$VSR_N$ respectively, and the shift registering signals $VSR_1$-$VSR_N$ are sequentially asserted. Except for the shift registering signal $VSR_N$, generated by the shift registering unit $10_N$, the shift registering signals $VSR_1$-$VSR_{N-1}$ generated by the shift registering units $10_1$-$10_{N-1}$ serve as the start signals of a next shift registering units $10_2$-$10_N$, respectively. The start signal of the shift registering signal $VSR_1$ is input by a specific circuit.

The buffering output units $11_1$-$11_N$ respectively receive the shift registering signals $VSR_1$-$VSR_N$. Each of the buffering output units $11_1$-$11_N$ comprises a logic gate 110 and buffer 111. For each buffering output unit, the logic gate 110 receives the respective shift registering signal, the shift registering signal generated by the next shift registering unit, and an enable signal ENBV. The logic gate 111 generates a logic signal V110 and outputs the logic signal V110 to an input terminal of the buffer 111. The buffer 111 outputs the logic signal V110 to generate a corresponding driving signal.

According to the circuit structure of the scan driving device 1 of FIG. 1, each shift registering unit requires one buffering output unit for generating a corresponding driving signal $S_1$~$S_N$. When the buffering output units $11_1$-$11_N$ use the buffers 111 with large driving capability, the area occupied by the buffers 111 is increased. Thus, if the display panel is designed with narrow borders, each buffering output unit in FIG. 1 would not be able to use a buffer with large driving capability due to the area limitations.

BRIEF SUMMARY OF THE INVENTION

An exemplary embodiment of a driving device outputs a plurality of driving signals which are sequentially asserted. The driving device comprises a shift register, a buffer unit, and a plurality of switch circuits. The shift register comprises a plurality of stages of shift registering units coupled in series. The shift registering units respectively generate a plurality of shift registering signals, and the shift registering signals are sequentially asserted. The buffer unit receives at least one input signal. The at least one input signal is periodically asserted, and the buffer unit outputs the at least one input signal. The switch circuits are coupled to the shift registering units to receive the shift registering signals, respectively. All of the switch circuits are coupled to the buffer unit to receive the at least one input signal, and the switch circuits sequentially output the at least one input signal to serve as the driving signals according to the assertion of the shift registering signals.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
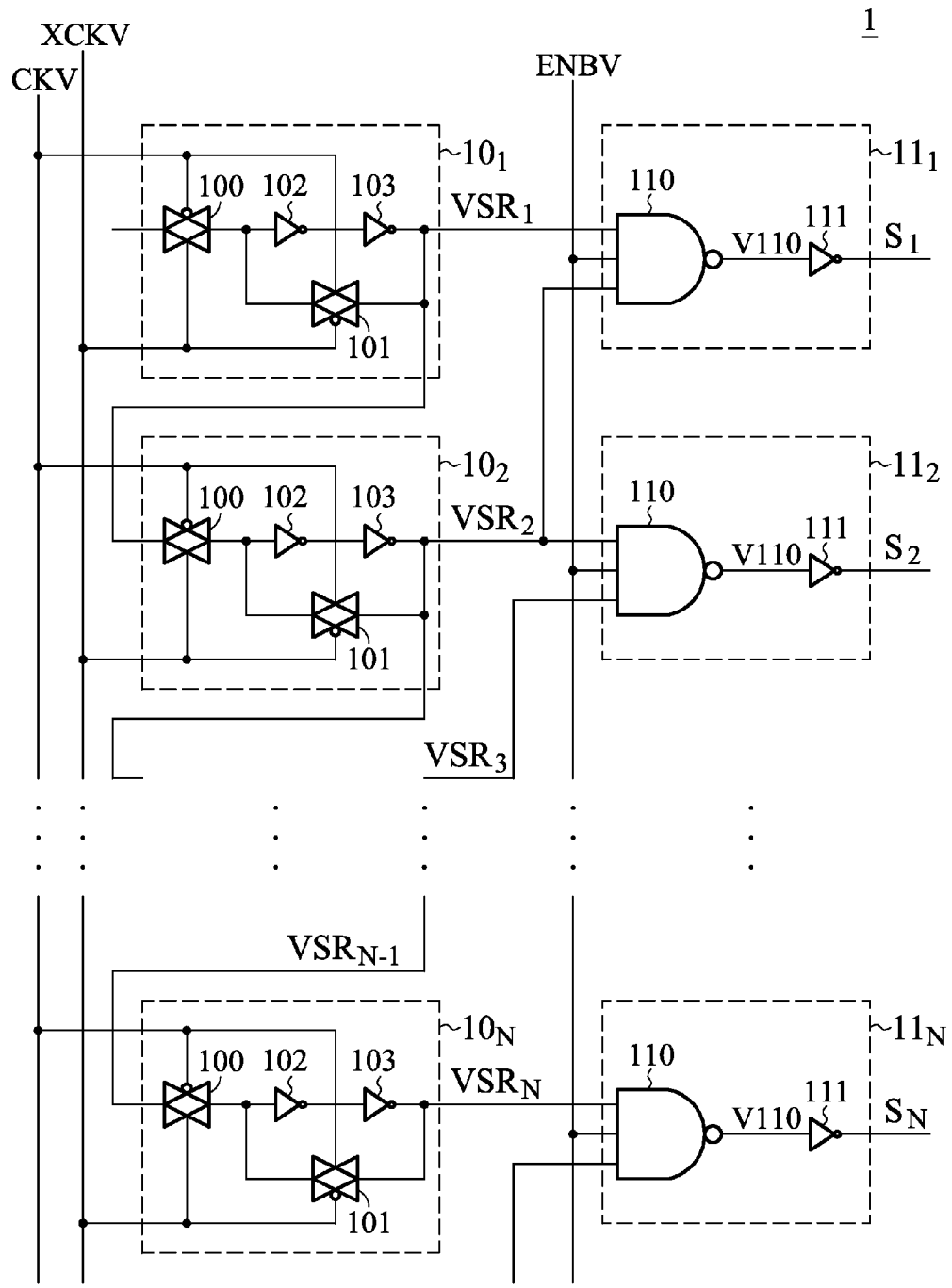
FIG. 1 shows a scan driving device in a conventional display panel.
Figure 2:
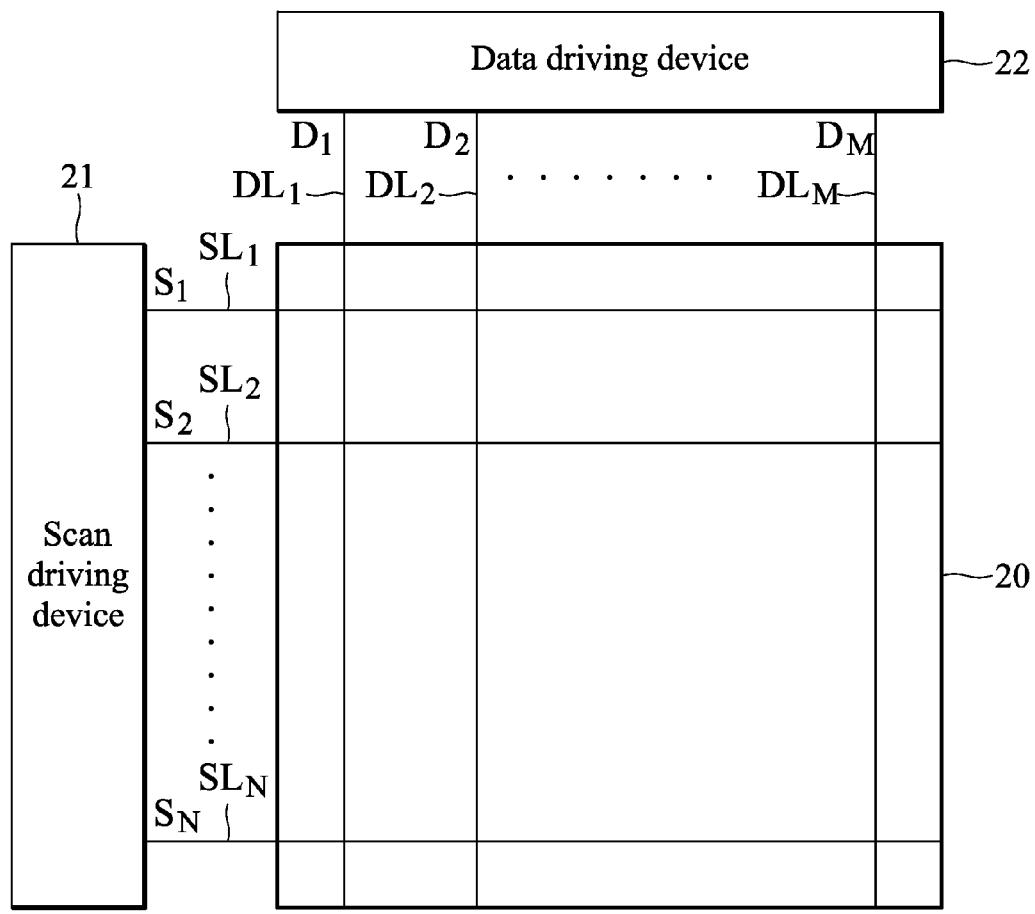
FIG. 2 shows an exemplary embodiment of display panel.

Display panels are provided. In an exemplary embodiment of a display panel in FIG. 2, a display panel 2 comprises a display array 20, a scan driving device 21, and a data driving device 22. The scan driving device 21 generates a plurality of driving signals $S_1$-$S_N$ which are sequentially asserted, wherein N is a positive integer. The scan driving device 21 provides the driving signals $S_1$-$S_N$ to the display array 20 through a plurality of scan lines $SL_1$-$SL_N$. The data driving device 22 provides data signals $D_1$-$D_M$ to the display array 20 through a plurality of data lines $DL_1DL_M$, wherein M is a positive integer. The detailed circuit of the scan driving device 21 will be described in the following.

Figure 3:
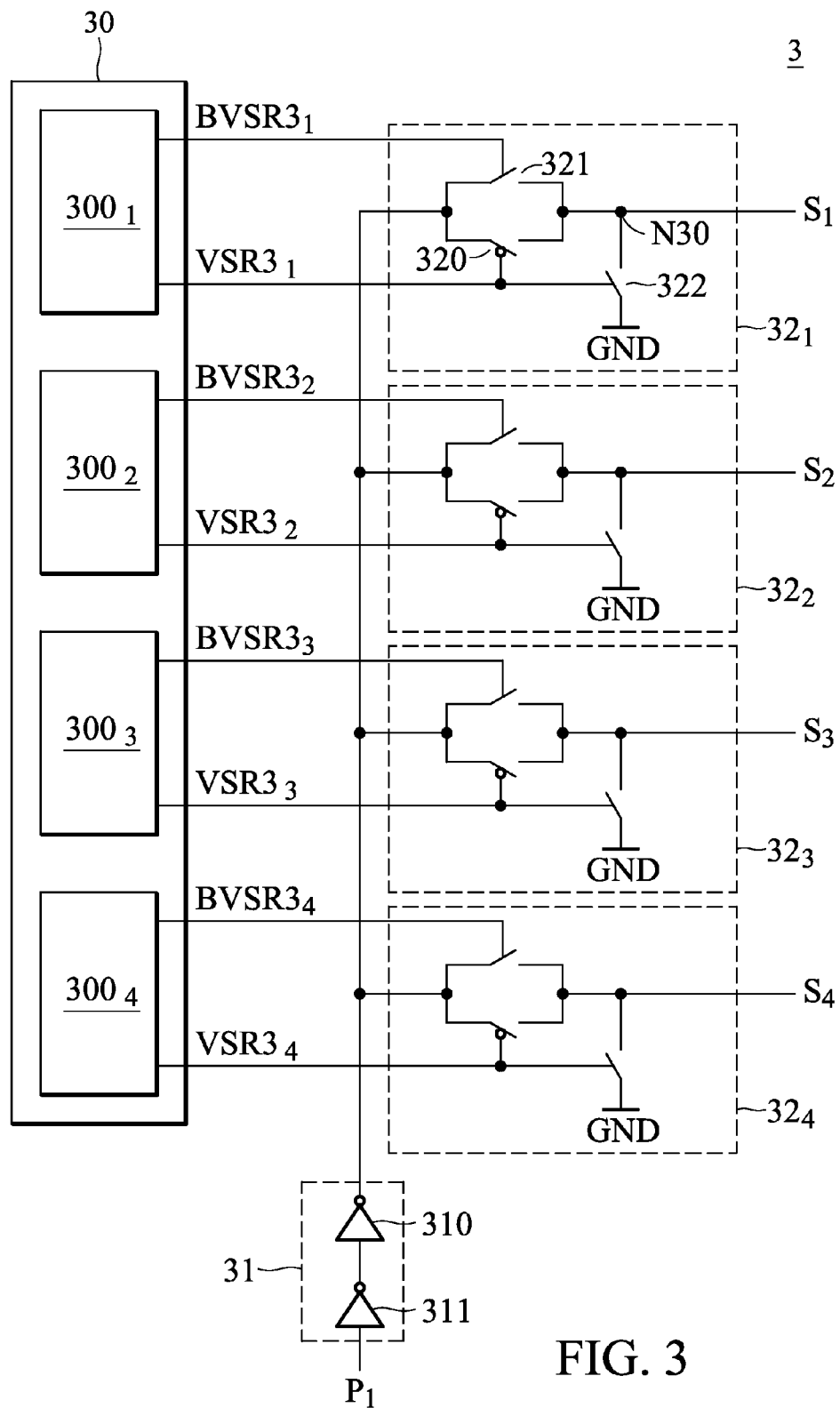
FIG. 3 shows an exemplary embodiment of a scan driving device.

FIG. 3 shows an exemplary embodiment of a scan driving device. Referring to FIG. 3, a scan driving device 3 is applied in the display panel 2 of FIG. 2 for generating the driving signals $S_1$-$S_N$. The scan driving device 3 comprises a shift register 30, a buffer unit 31, and a plurality of stages of switch circuits $32_1$-$32_N$. The shift register 30 comprises a plurality of stages of the shift registering units $300_1$-$300_N$. For clearly describing the embodiment of FIG. 3, four driving signals $S_1$-$S_4$ generated by the scan driving device 3 are given an example, that is N=4. In the example, there are four shift registering units $300_1$-$300_4$ and four switch circuits $32_1$-$32_4$ in the scan driving device 3. The shift registering units $300_1$-$300_4$ generate shift registering signals $VSR3_1$-$VSR3_4$ and inverse signals $BVSR3_1$-$BVSR3_4$ of the shift registering signals $VSR3_1$-$VSR3_4$ respectively. The buffer unit 31 receives at least one input signal. In the embodiment, the buffer unit 31 receives one input signal P1. The buffer unit 31 comprises inverter units 310 and 311 coupled in series. The buffer unit 31 outputs the input signal P1. The switch circuits $32_1$-$32_4$ are respectively coupled to the shift registering units $300_1$-$300_4$ to receive the shift registering signals $VSR3_1$-$VSR3_4$ and the inverse shift registering signals $BVSR3_1$-$BVSR3_4$.

Referring to FIG. 3, each of the switch circuits $32_1$-$32_4$ comprises switch elements 320-322. The switch circuit $32_1$ is given as an example for description in the following. A control terminal of the switch element 320 receives the corresponding the shift registering signal $VSR3_1$, a first terminal thereof receives the input signal P1, and a second terminal is coupled to a node N30. A control terminal of the switch element 321 receives the corresponding inverse shift registering signal $BVSR3_1$, a first terminal thereof receives the input signal P1, and a second terminal is coupled to the node N30. A control terminal of the switch element 322 receives the corresponding shift registering signal $VSR3_1$, a first terminal thereof is coupled to the node N30, and a second terminal thereof is coupled to a ground terminal GND. In the embodiment, the switch element 320 is turned on by a low-level signal, while the switch elements 321 and 322 are turned on by a high-level signal. Moreover, the switch elements 320 and 322 are controlled by the shift registering signal $VSR3_1$, and the switch element 321 is controlled by the inverse shift registering signal $BVSR3_1$. Accordingly, the state of the switch element 321 is the same as the state of the switch element 320, while the state of the switch element 322 is different from the state of the switch element 320.

Figure 4:
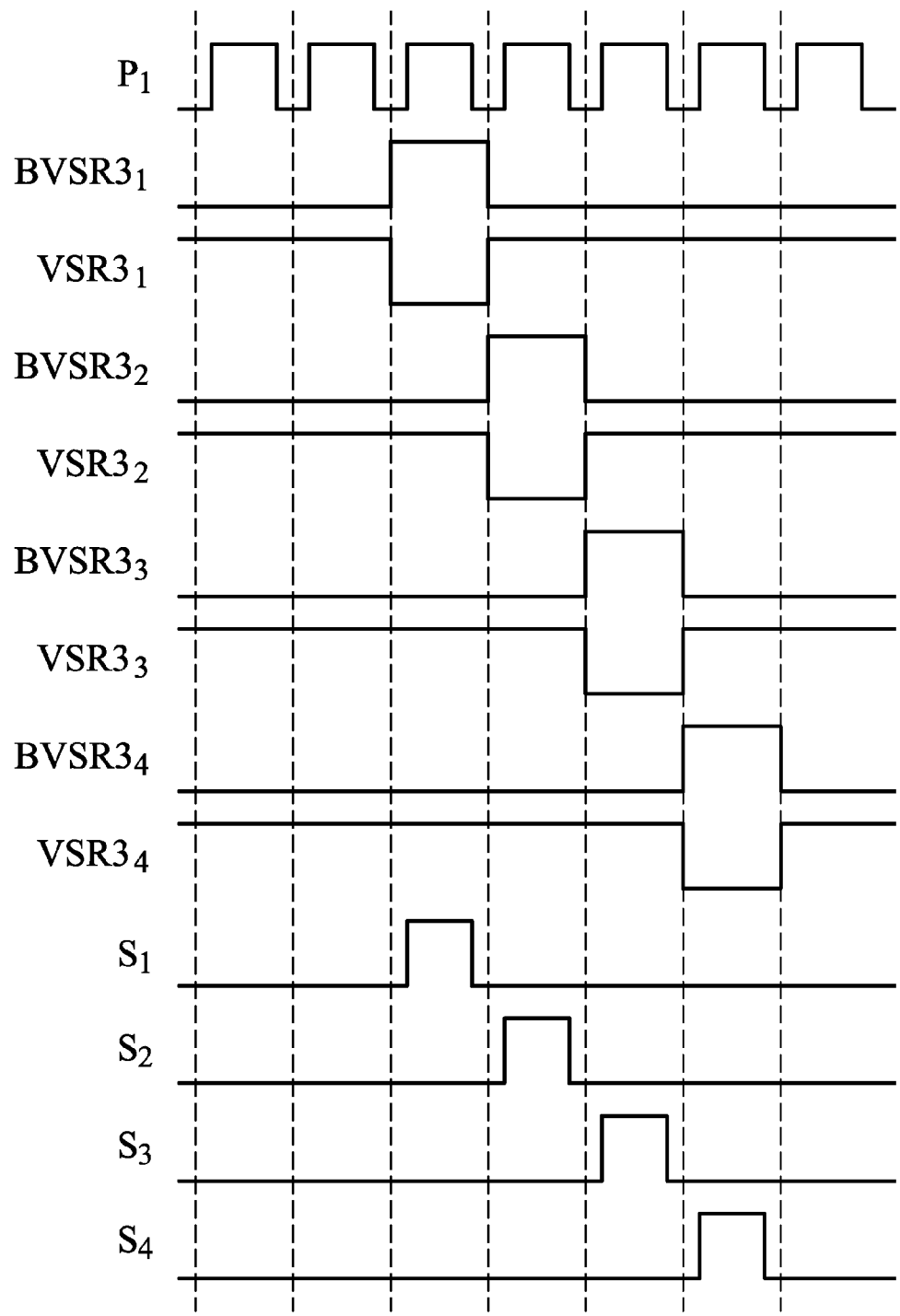
FIG. 4 is a signal timing chart of the scan driving circuit in FIG. 3.

FIG. 4 is a signal timing chart of the scan driving device 3 in FIG. 3. Referring to FIG. 4, the input signal P1 is periodically asserted. The shift registering signals $VSR3_1$-$VSR3_4$ generated by the shift registering units $300_1$-$300_4$ are sequentially asserted at a low level, and the assertion periods of the shift registering signals $VSR3_1$-$VSR3_4$ are not overlapped. Since the shift registering signals $VSR3_1$-$VSR3_4$ are sequentially asserted, the switch elements 320 of the switch circuits $32_1$-$32_4$ are turned on sequentially, and the switch elements 322 of the switch circuits $32_1$-$32_4$ are turned off sequentially, so that the switch circuits $32_1$-$32_4$ sequentially output the input signal P1 to the respective nodes N30 to serve as the driving signals $S_1$-$S_4$. In other words, the driving signals $S_1$-$S_4$ are sequentially asserted. At this time, the switch elements 321 of the switch circuits $32_1$-$32_4$ are turned on sequentially according to the inverse shift registering signals $BVSR3_1$-$BVSR3_4$. When one shift registering signal is not asserted (at a high level), the switch elements 320 and 321 of the corresponding switch circuit are turned off, and the switch element 322 thereof is turned on, so that the corresponding switch circuit outputs the voltage signal of the ground terminal GND to the respective node N30 to serve as the corresponding driving signal. In other words, the corresponding driving signal is not asserted.

According to the scan driving device 3 in FIG. 3, the switch circuits $32_1$-$32_N$ share one buffer unit 31. Thus, the scan driving device 3 occupies smaller area and may be applied in a display panel with a narrow border design. When the buffer unit 31 having large driving capability is used, the required area occupied by the scan driving device 3 is only minimally increased.

Figure 5:
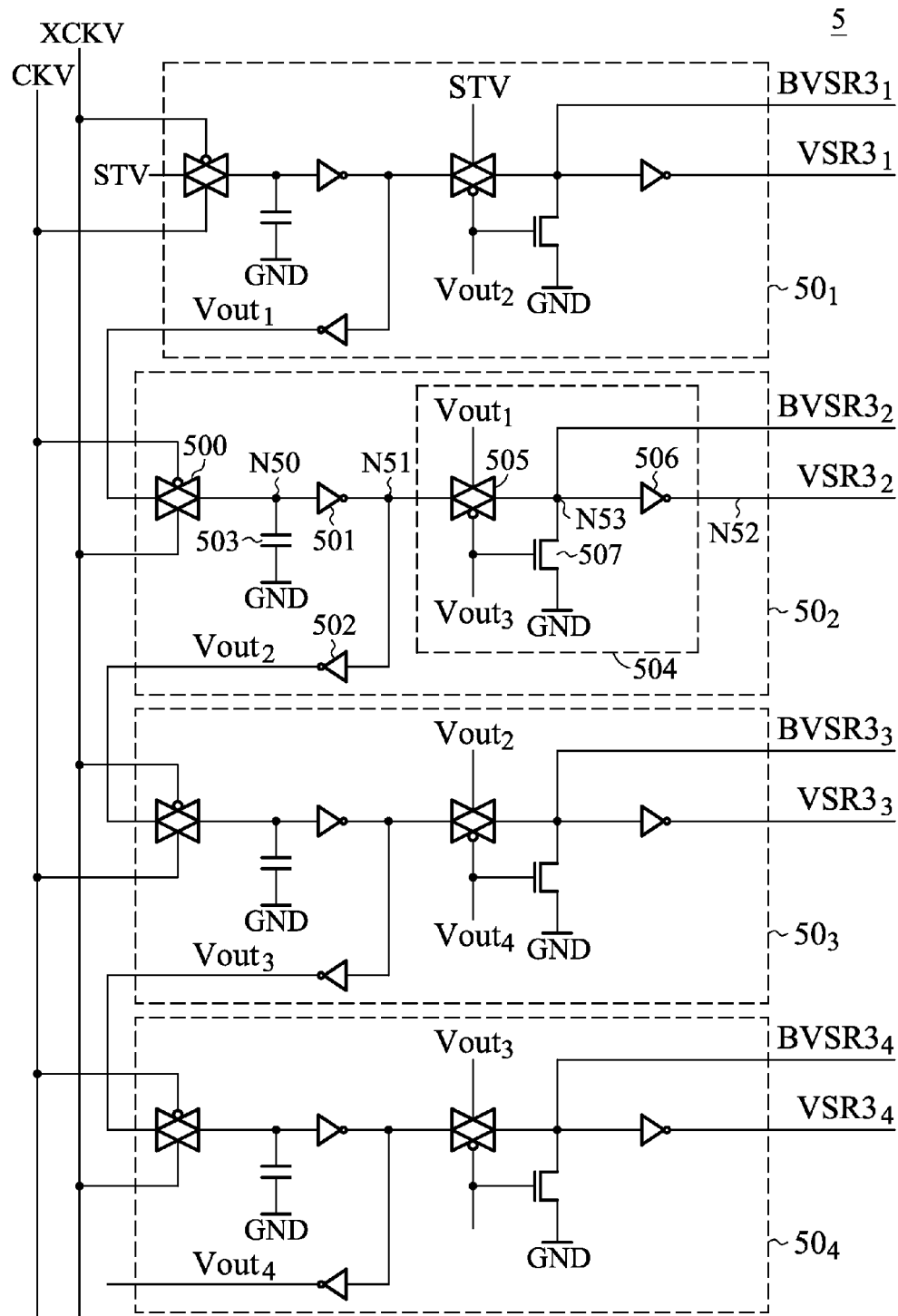
FIG. 5 shows an exemplary embodiment of shift register of the scan driving circuit in FIG. 3.

The shift register 30 which generates the shift registering signals $VSR3_1$-$VSR3_4$ and the inverse shift registering signals $BVSR3_1$-$BVSR3_4$ can be implemented by several embodiments. Referring to FIG. 5, a shift register 5 generates the shift registering signals $VSR3_1$-$VSR3_4$ and the inverse shift registering signals $BVSR3_1$-$BVSR3_4$ which are provided to the switch circuits $32_1$-$32_4$. The shift register 5 comprises shift registering units $50_1$-$50_4$, and the shift registering units $50_1$-$50_4$ have the same circuit structure. In the following, the shift registering unit $50_2$ is given as example for the detailed description. The shift registering unit $50_2$ comprises a switch unit 500, inverter units 501 and 502, a capacitor 503, and an output unit 504. An input terminal of the switch unit 500 receives a start signal, and an output terminal thereof is coupled to a node N50. The switch unit 500 is controlled by the clock signals CKV and XCKV, wherein the clock signal XCKV is inverse to the clock signal CKV. An input terminal of the inverter unit 501 is coupled to the node N50, and an output terminal thereof is coupled to a node N51. The capacitor 503 is coupled between the node N50 and the ground terminal GND. The output unit 504 is coupled between the node N51 and an output node N52 and generates the corresponding shift registering signal $VSR3_2$. The output unit 504 further generates the corresponding inverse shift registering signal $BVSR3_2$. An input terminal of the inverter unit 502 is coupled to the node N51, and an output terminal thereof generates an output signal $Vout_2$. Referring to FIG. 5, except for the output signal $Vout_4$ generated by the shift registering unit $50_4$, the output signals $Vout_1$-$Vout_3$ generated by the shift registering units $50_1$-$50_3$ serve as the start signals of the next shift registering units $50_2$-$50_4$ respectively. The shift registering unit $50_1$ receives a signal STV to serve as its start signal.

Referring to FIG. 5, the output unit 504 comprises a switch unit 505, an inverter unit 506, and a transistor 507. An input terminal of the switch unit 505 is coupled to the node N51, and an output terminal thereof is coupled to a node N53. The switch unit 505 is controlled by the output signal $Vout_1$ generated by the previous shift registering unit $50_1$ and the output signal $Vout_3$ generated by the next shift registering unit $50_3$. A gate of the transistor 507 receives the output signal $Vout_3$ generated by the next shift registering unit $50_3$, a drain thereof is coupled to the node N53, and a source thereof is coupled to the ground terminal GND. According to the operations of the switch unit 505 and the transistor 507, the inverse shift registering signal $BVSR3_2$ is generated at the node N53. The inverter unit 506 is coupled to the node N53 for receiving the inverse shift registering signal $BVSR3_2$ and generates the shift registering signal $VSR3_2$ at the output node N52. The shift registering signal $VSR3_2$ generated by the shift registering unit $50_2$ is provided to the control terminals of the switch elements 320 and 322 of the switch circuit $32_2$ as shown in FIG. 3, and the inverse shift registering signal $BVSR3_2$ is provided to the control terminal of the switch element 321 of the switch circuit $32_2$. The shift registering units $50_1$ and $50_3$-$50_4$ perform the same operation as the shift registering unit $50_2$ according to the clock signals CKV and XCKV.

In the embodiment of FIG. 5, the switch unit 505 of the shift registering unit $50_1$ is controlled by the start signal STV and the output signal $Vout_2$ generated by the next shift registering unit $50_2$, and the gate of the transistor 507 thereof also receives the output signal $Vout_2$. The switch unit 505 of the shift registering unit $50_4$ is controlled by the output signal $Vout_3$ generated by the previous shift registering unit $50_3$ and an external input signal, and the gate of the transistor 507 thereof also receives the external input signal.

Figure 6:
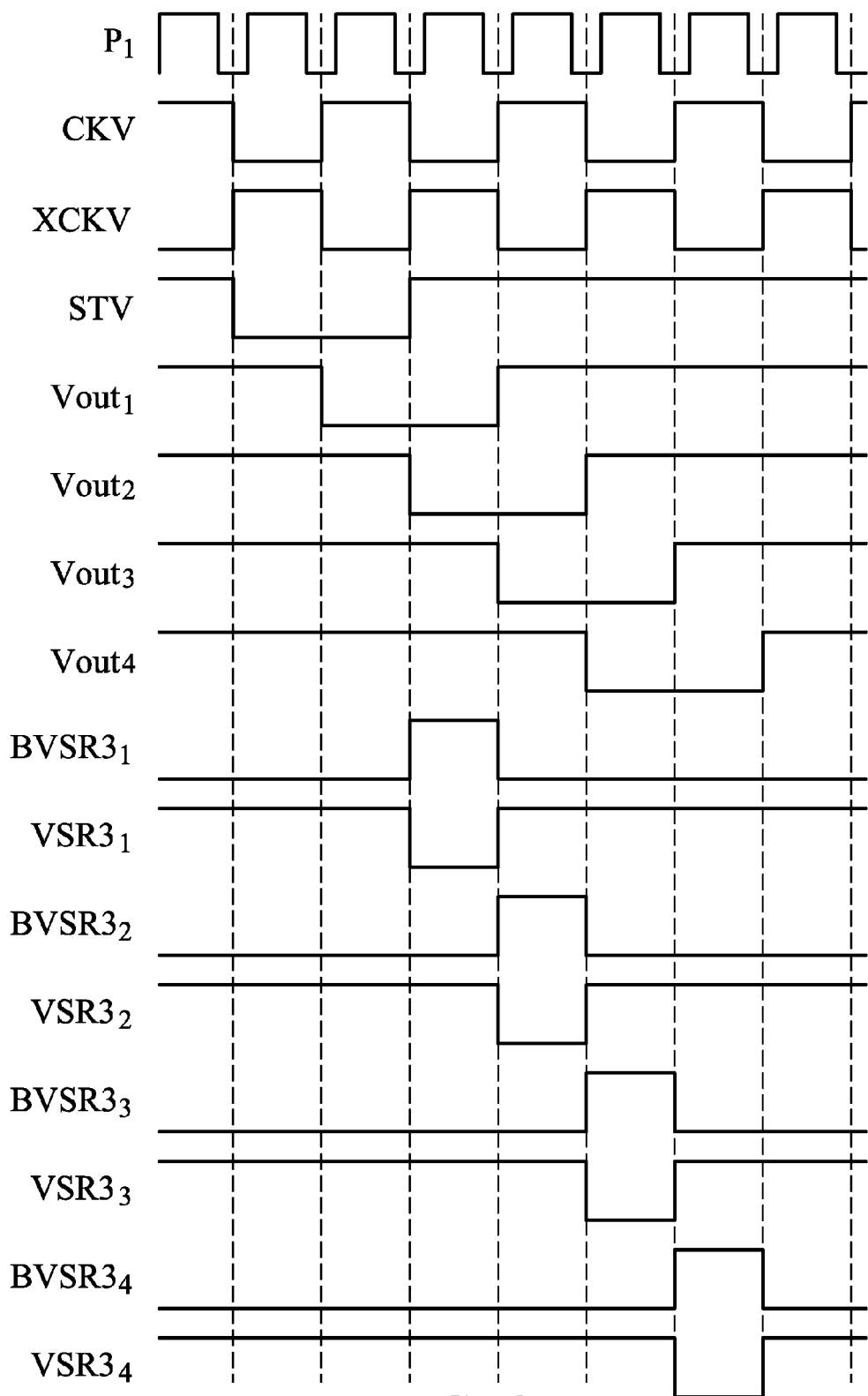
FIG. 6 is a signal timing chart of the shift register in FIG. 5.

FIG. 6 is a signal timing chart of the shift register 5 in FIG. 5. In order to clearly show the relationship between the shift registering signals $VSR3_1$-$VSR3_4$ and the inverse shift registering signals $BVSR3_1$-$BVSR3_4$ generated by the shift register 5 and the driving signals $S_1$-$S_4$ generated by the switch circuits $32_1$-$32_4$, the waveform of the input signal P1 is presented in FIG. 6 to correlate with the signal timing chart of FIG. 4.

Figure 7A:
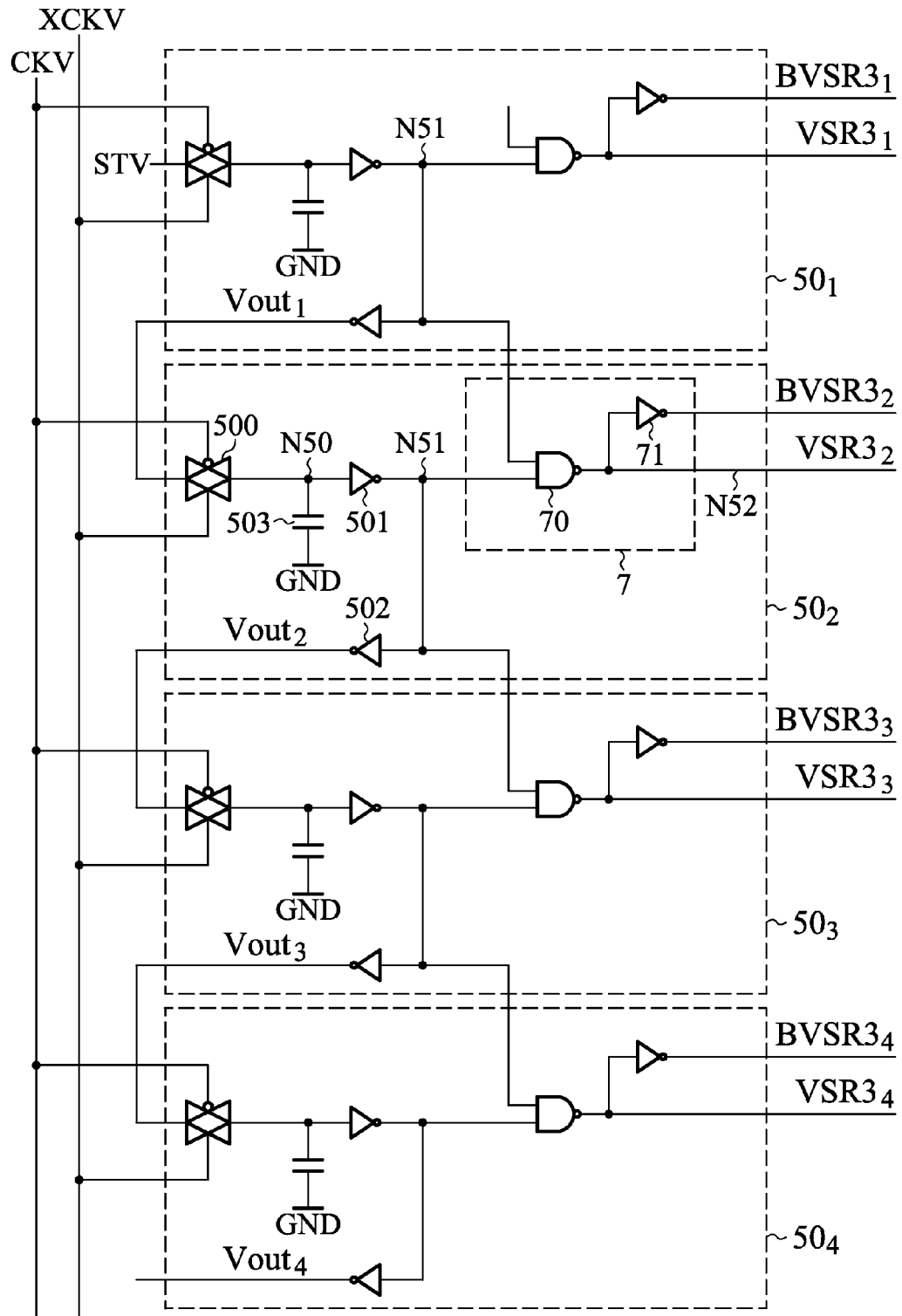
FIG. 7A shows another exemplary embodiment of shift register of the scan driving circuit in FIG. 3.

In some embodiments, the output unit 504 in each of the shift registering units $50_1$-$50_4$ of the shift register 5 can be implemented by logic gates. In the following, the shift registering unit $50_2$ is given as an example. Referring to FIG. 7A, an output unit 7 is coupled between the node N51 and the output node N52 and generates the shift registering signal $VSR3_2$ at the output node N52. The output unit 7 further generates the inverse shift registering signal $BVSR3_2$. The output unit 7 comprises an NAND gate 70 and an inverter unit 71. One input terminal of the NAND gate 70 is coupled to its node N51, the other input terminal thereof is coupled to the node N51 of the previous shift registering unit $50_1$, and an output terminal thereof generates the shift registering signal $VSR3_2$. The inverter unit 71 receives the shift registering signal $VSR3_2$ and generates the inverse shift registering signal $BVSR3_2$.

In the embodiment of FIG. 7A, one input terminal of the NAND gate 70 of the shift registering unit $50_1$ is coupled to its node N51, and the other input terminal thereof is receives an inverse signal of the start signal STV.

Figure 7B:
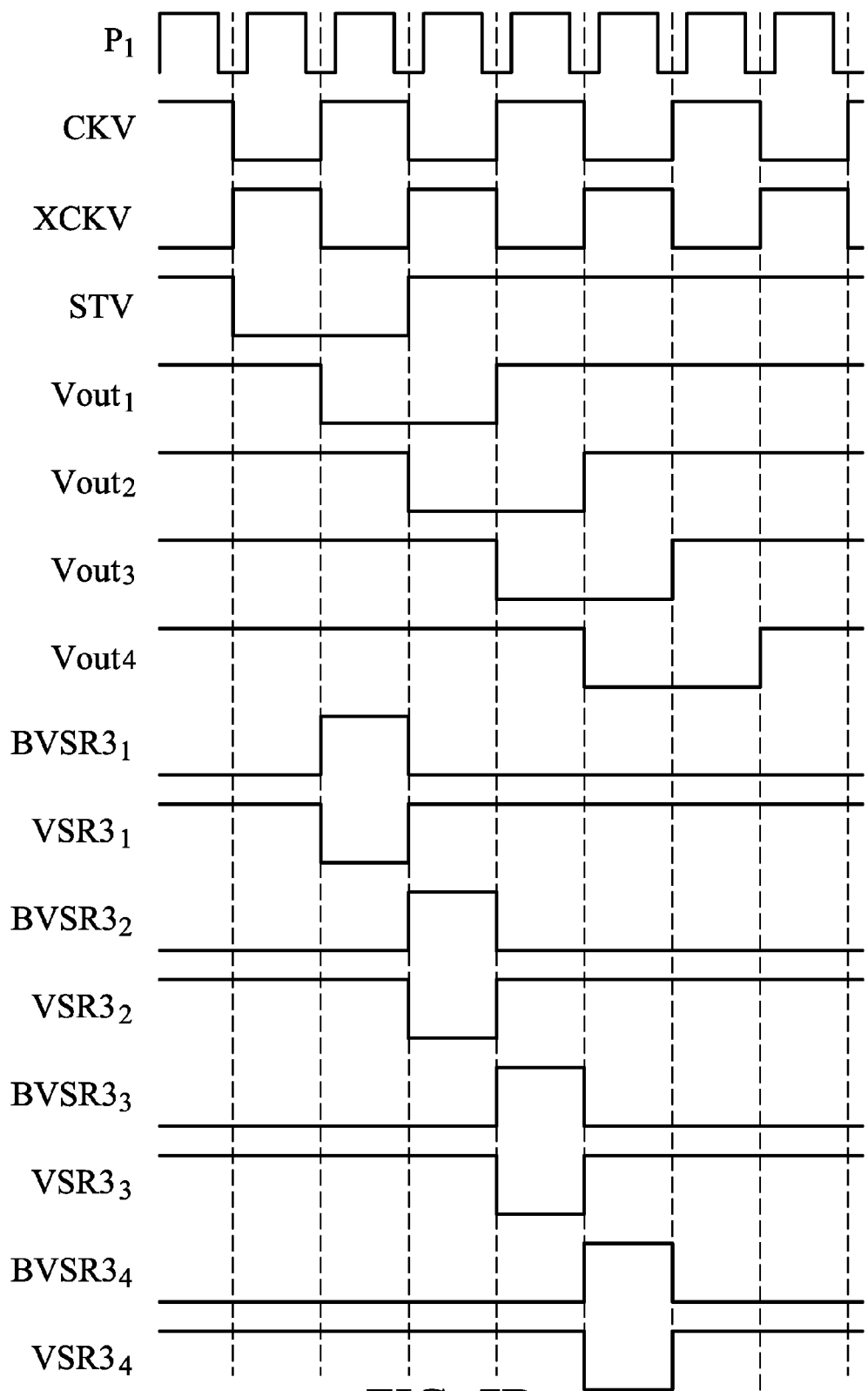
FIG. 7B is a signal timing chart of the shift register in FIG. 7A.

FIG. 7B is a signal timing chart of the output unit 7 in FIG. 7A. In order to clearly show the relationship between the shift registering signals $VSR3_1$-$VSR3_4$ and the inverse shift registering signals $BVSR3_1$-$BVSR3_4$ generated by the output unit 7 and the driving signals $S_1$-$S_4$ generated by the switch circuits $32_1$-$32_4$, the waveform of the input signal P1 is presented in FIG. 7A to build correlate with the signal timing chart of FIG. 4.

Figure 8:
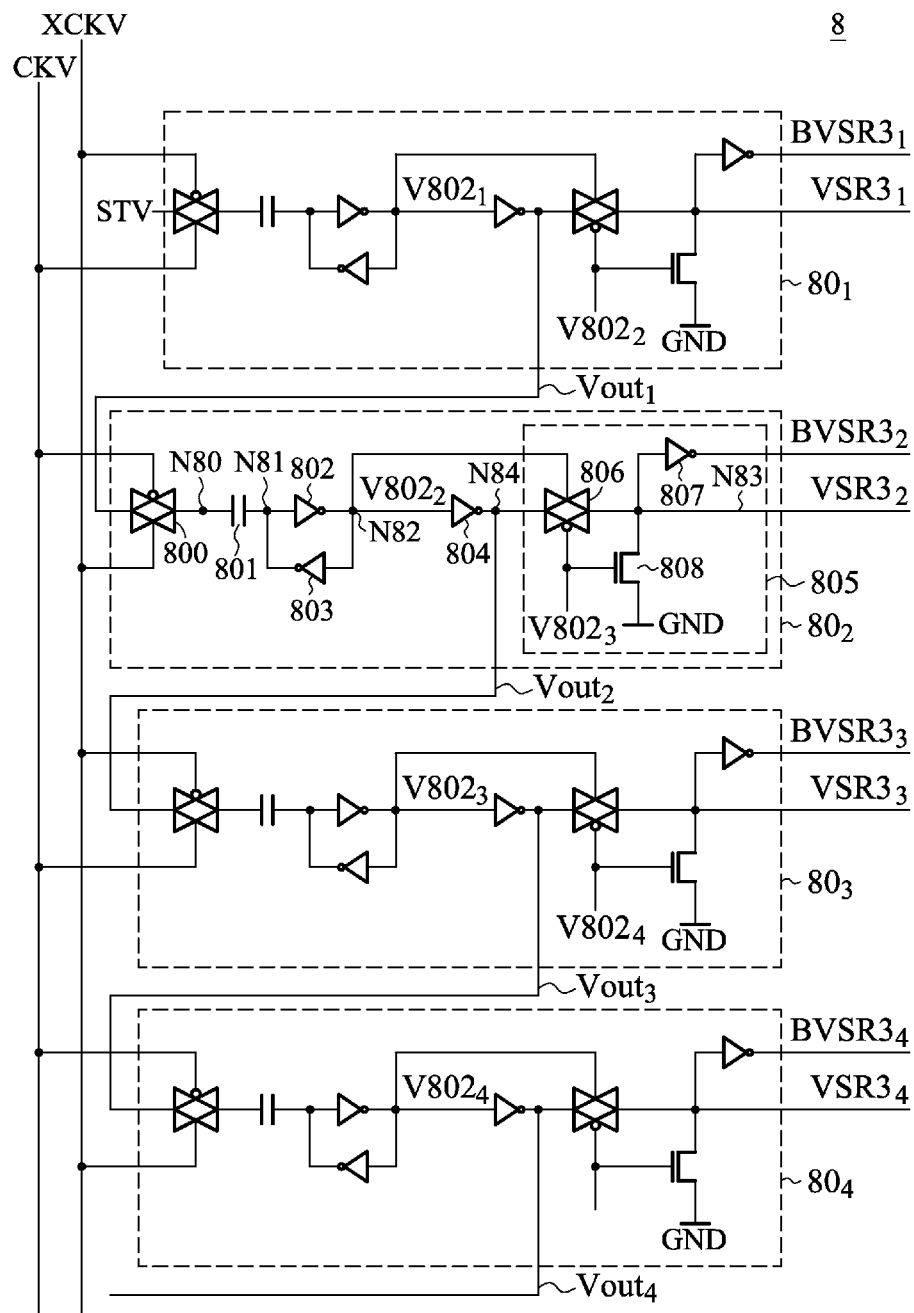
FIG. 8 shows another exemplary embodiment of shift register of the scan driving circuit in FIG. 3.

FIG. 8 shows another exemplary embodiment of a shift register for the scan driving device 3 of FIG. 3. Referring to FIG. 8, a shift register 8 generates the shift registering signals $VSR3_1$-$VSR3_4$ and the inverse shift registering signals $BVSR3_1$-$BVSR3_4$ which are provided to the switch circuits $32_1$-$32_4$. The shift register 8 comprises shift registering units $80_1$-$80_4$, and the shift registering units $80_1$-$80_4$ have the same circuit structure. In the following, the shift registering unit $80_2$ is given as example for the detailed description. The shift registering unit $80_2$ comprises a switch unit 800, a capacitor 801, inverter units 802-804, and an output unit 805. An input terminal of the switch unit 800 receives a start signal, and an output terminal thereof is coupled to a node N80. The switch unit 800 is controlled by the clock signals CKV and XCKV, wherein the clock signal XCKV is inverse to the clock signal CKV. The capacitor 801 is coupled between the node N80 and a node N81. An input terminal of the inverter unit 802 is coupled to the node N81, and an output terminal thereof is coupled to a node N82. The inverter unit 802 generates a control signal $V802_2$ at the node N82. An input terminal of the inverter unit 803 is coupled to the node N82, and an output terminal thereof is coupled to the node N81. The output unit 805 is coupled between the node N82 and an output terminal N83 and generates the corresponding shift registering signal $VSRT3_2$ at the output terminal N83. An input terminal of the inverter unit 804 is coupled to the node N82, and an output terminal thereof is coupled to a node N84. The inverter unit 804 generates an output signal $Vout_2$ at the node N84. Referring to FIG. 8, except for the output signal $Vout_4$ generated by the shift registering unit $80_4$, the output signals $Vout_1$-$Vout_3$ generated by the shift registering units $80_1$-$80_3$ serve as the start signals of the next shift registering units $80_2$-$80_4$ respectively. The shift registering unit $80_1$ receives a signal STV to serve as its start signal.

Referring to FIG. 8, the output unit 805 comprises a switch unit 806, an inverter unit 807, and a transistor 808. An input terminal of the switch unit 806 is coupled to the node N84, and an output terminal thereof is coupled to a node N83. The switch unit 806 is controlled by the control signal $V802_2$ at the node N82 and the control signal $V802_3$ is generated by the next shift registering unit $80_3$. A gate of the transistor 808 receives the control signal $V802_3$ generated by the next shift registering unit $80_3$, a drain thereof is coupled to the output node N83, and a source thereof is coupled to the ground terminal GND. According to the operations of the switch unit 806 and the transistor 808, the shift registering signal $VSR3_2$ is generated at the output node N83. The inverter unit 807 is coupled to the output node N83 for receiving the shift registering signal $VSR3_2$ and generates the inverse shift registering signal $BVSR3_2$. The shift registering signal $VSR3_2$ generated by the shift registering unit $80_2$ is provided to the control terminals of the switch elements 320 and 322 of the switch circuit $32_2$ as shown in FIG. 3 and the inverse shift registering signal $BVSR3_2$ is provided to the control terminal of the switch element 321 of the switch circuit $32_2$. The shift registering units $80_1$ and $80_3$-$80_4$ perform the same operation as the shift registering unit $80_2$ according to the clock signals CKV and XCKV.

In the embodiment of FIG. 8, the switch unit 806 of the shift registering unit $80_4$ is controlled by the control signal $V802_4$ and an external input signal, and the gate of the transistor 808 also receives the external input signal.

The signal timing chart of the shift register 8 in FIG. 8 is referred to as the signal timing chart in FIG. 7B.

Figure 9:
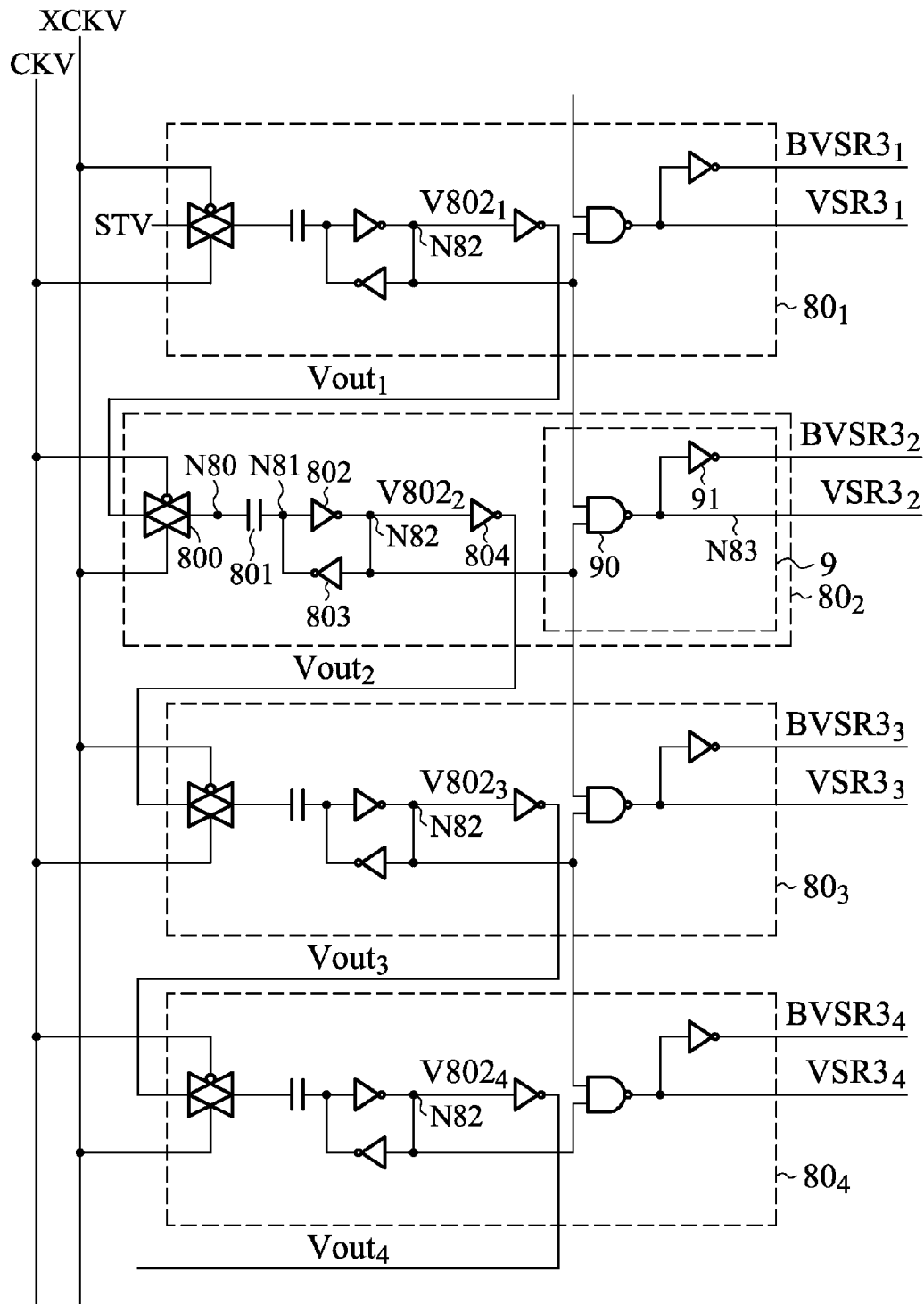
FIG. 9 shows another exemplary embodiment of shift register of the scan driving circuit in FIG. 3.

In some embodiments, the output unit 805 in each of the shift registering units $80_1$-$80_4$ of the shift register 8 can be implemented by logic gates. In the following, the shift registering unit $80_2$ is given as an example. Referring to FIG. 9, an output unit 9 is coupled between the node N82 and the output node N83 and generates the shift registering signal $VSR3_2$ at the output node N83. The output unit 9 further generates the inverse shift registering signal $BVSR3_2$. The output unit 9 comprises an NAND gate 90 and an inverter unit 91. One input terminal of the NAND gate 90 receives the control signal $V802_2$ at its node N82, the other input terminal thereof receives the control signal $V802_1$ at the node N82 of the previous shift registering unit $80_1$, and an output terminal thereof generates the shift registering signal $VSR3_2$. The inverter unit 91 receives the shift registering signal $VSR3_2$ and generates the inverse shift registering signal $BVSR3_2$.

In the embodiment of FIG. 9, one input terminal of the NAND gate 90 of the shift registering unit $80_1$ receives the control signal $V802_1$, and the other input terminal thereof receives an external input signal.

Figure 10:
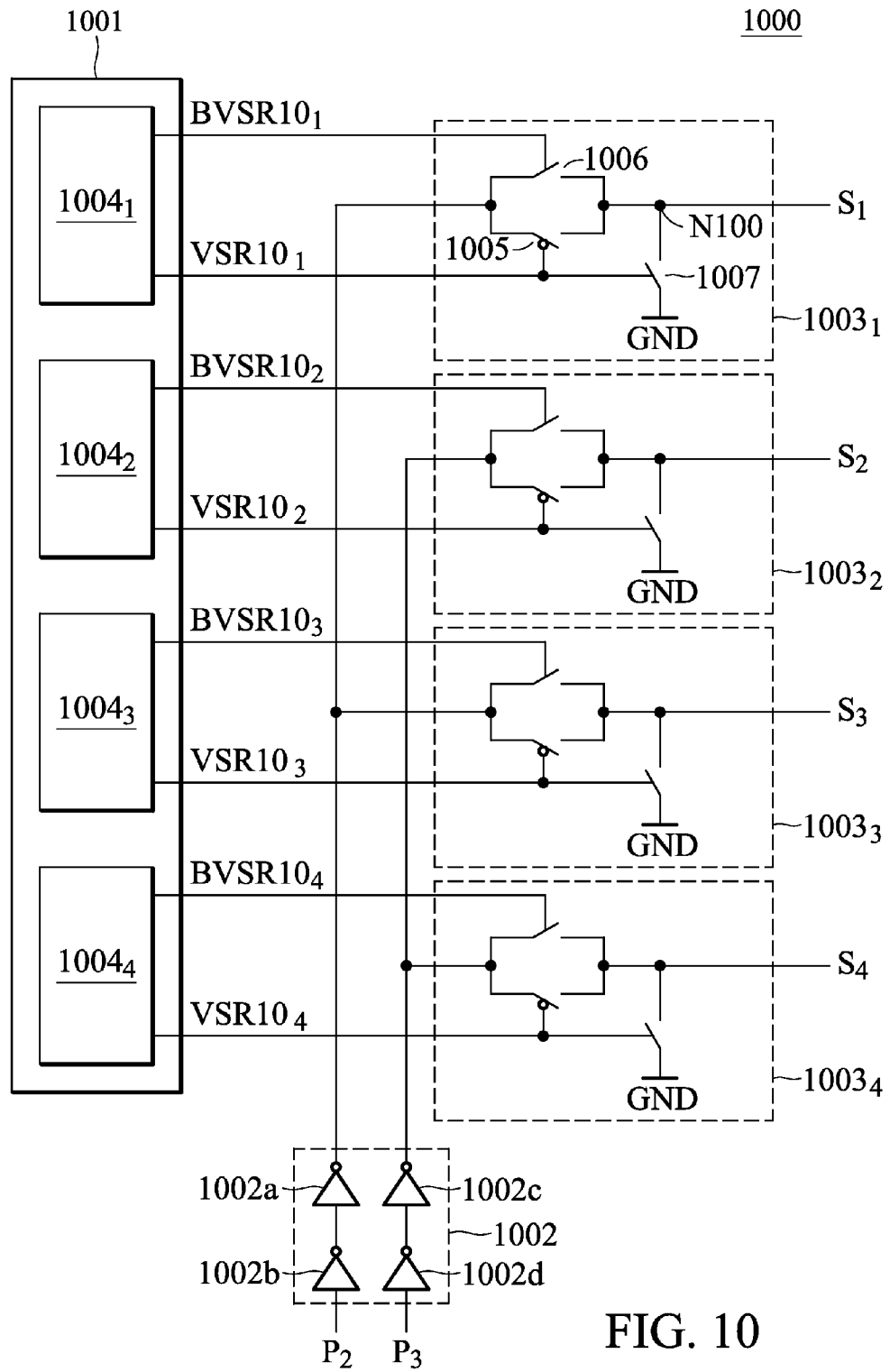
FIG. 10 shows another exemplary embodiment of a scan driving device.

FIG. 10 shows another exemplary embodiment of a scan driving device. Referring to FIG. 10, a scan driving device 1000 is applied in the display panel 2 of FIG. 2 for generating the driving signals $S_1$-$S_N$. The scan driving device 1000 comprises a shift register 1001, a buffer unit 1002, and a plurality of stages of switch circuits $1003_1$-$1003_N$. The shift register 1001 comprises a plurality of stages of the shift registering units $1004_1$-$1004_N$. For clearly describing the embodiment of FIG. 10, four driving signals $S_1$-$S_4$ generated by the scan driving device 1000 are given an example, that is N=4. In the example, there are four shift registering units $1004_1$-$1004_4$ and four switch circuits $1003_1$-$1003_4$ in the scan driving device 1000. The shift registering units $1004_1$-$1004_4$ generate shift registering signals $VSR10_1$-$VSR10_4$ and inverse signals $BVSR10_1$-$BVSR10_4$ of the shift registering signals $VSR10_1$-$VSR10_4$ respectively. The buffer unit 1002 receives two input signals P2 and P3 which are alternately asserted. The buffer unit 1002 comprises two inverter units 1002a and 1002b coupled in series and two inverter units 1002c and 1002d coupled in series. The inverter units 1002a and 1002b form a buffer element to receive the input signal P2, while the inverter units 1002c and 1002d form another buffer element to receive the input signal P3. The buffer unit 1002 outputs the input signal P2 through the buffer element formed by the inverter units 1002a and 1002b and outputs the input signal P3 through the buffer element formed by the inverter units 1002c and 1002d. The switch circuits $1003_1$-$1003_4$ are respectively coupled to the shift registering units $1004_1$-$1004_4$ to receive the shift registering signals $VSR10_1$-$VSR10_4$ and the inverse shift registering signals $BVSR10_1$-$BVSR10_4$.

Referring to FIG. 10, each of the switch circuits $1003_1$-$1003_4$ comprises switch elements 1005-1007. The switch circuit $1003_1$ is given as an example for description in the following. A control terminal of the switch element 1005 receives the corresponding the shift registering signal $VSR10_1$, a first terminal thereof receives the input signal P2, and a second terminal is coupled to a node N100. A control terminal of the switch element 1006 receives the corresponding inverse shift registering signal $BVSR10_1$, a first terminal thereof receives the input signal P2, and a second terminal is coupled to the node N100. A control terminal of the switch element 1007 receives the corresponding shift registering signal $VSR10_1$, a first terminal thereof is coupled to the node N100, and a second terminal thereof is coupled to a ground terminal GND. In the embodiment, the switch element 1005 is turned on by a low-level signal, while the switch elements 1006 and 1007 are turned on by a high-level signal. Moreover, the switch elements 1005 and 1007 are controlled by the shift registering signal $VSR10_1$, and the switch element 1006 is controlled by the inverse shift registering signal $BVSR10_1$. Accordingly, the state of the switch element 1006 is the same as the state of the switch element 1005, while the state of the switch element 1007 is different from the state of the switch element 1005.

Referring to FIG. 10, the first terminals of the switch element 1005 in the odd stages of the switch circuits $1003_1$ and $1003_3$ receive the input signal P2, while the first terminals of the switch element 1005 in the even stages of the switch circuits $1003_2$ and $1003_4$ receive the input signal P3.

Figure 11:
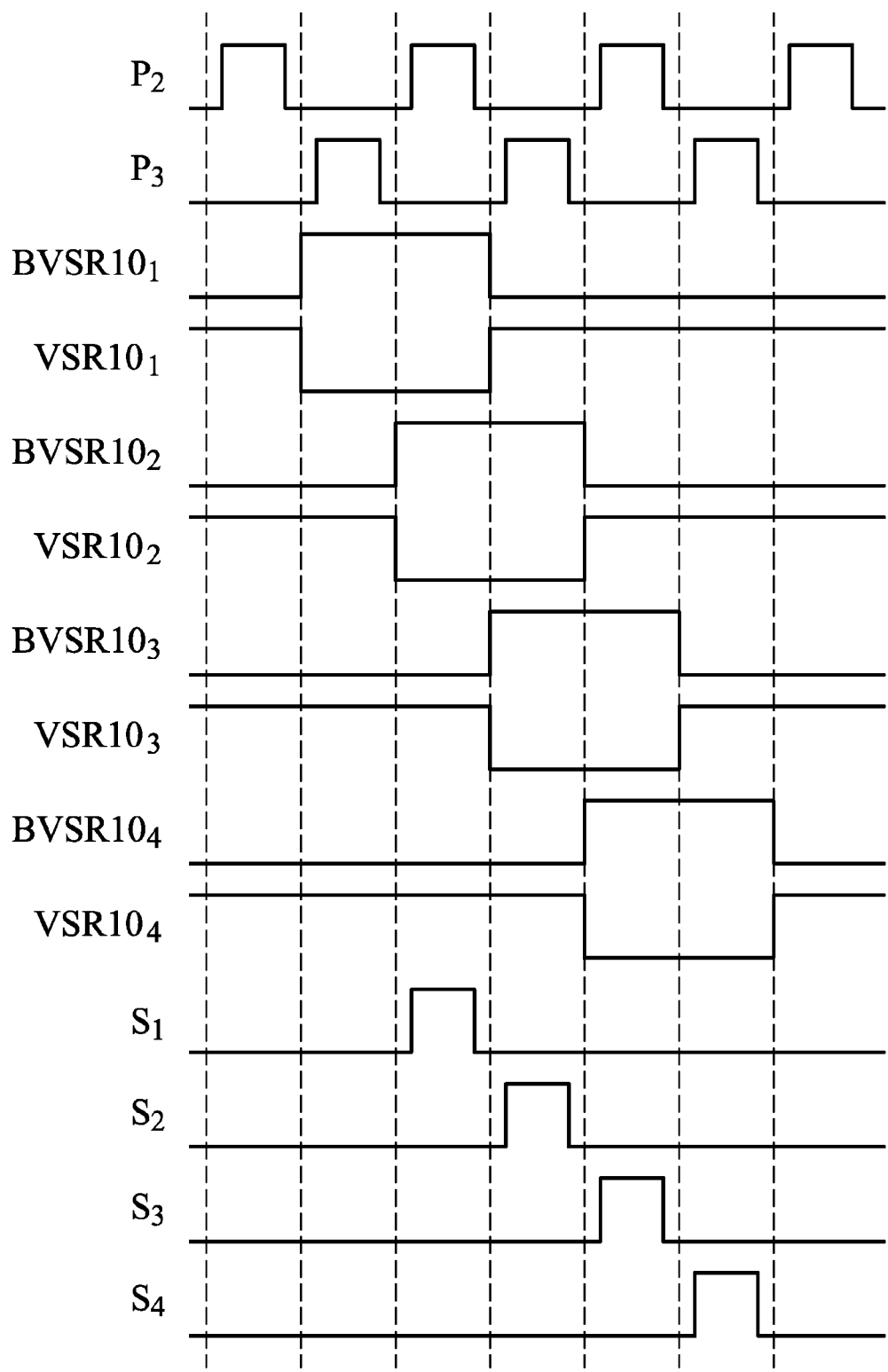
FIG. 11 is a signal timing chart of the scan driving circuit in FIG. 10.

FIG. 11 is a signal timing chart of the scan driving device 1000 in FIG. 10. Referring to FIG. 11, each of the input signals P2 and P3 is periodically asserted. Particularly, the input signals P2 and P3 are alternately asserted. The shift registering signals $VSR10_1$-$VSR10_4$ generated by the shift registering units $1004_1$-$1004_4$ are sequentially asserted (at a low level), and the assertion periods of the shift registering signals generated by the two adjacent shift registering units are partially overlapped. Since the shift registering signals $VSR10_1$-$VSR10_4$ are sequentially asserted, the switch elements 1005 of the switch circuits $1003_1$-$1003_4$ are turned on sequentially, and the switch elements 1007 of the switch circuits $1003_1$-$1003_4$ are turned off sequentially. At this time, the switch elements 1006 of the switch circuits $1003_1$-$1003_4$ are turned on sequentially according to the inverse shift registering signals $BVSR10_1$-$BVSR10_4$. When one of the shift registering signals $VSR10_1$ and $VSR10_3$ provided to the odd stages of the switch circuits $1003_1$ and $1003_3$ is asserted, the corresponding switch circuit $1003_1$/$1003_3$ outputs the input signal P2 to the respective nodes N100 to serve as the corresponding driving signal $S_1$/$S_3$. In other words, the driving signal $S_1$/$S_3$ is asserted. When one of the shift registering signals $VSR10_2$ and $VSR10_4$ provided to the even stages of the switch circuits $1003_2$ and $1003_4$ is asserted, the corresponding switch circuit $1003_2$/$1003_4$ outputs the input signal P3 to the respective nodes N100 to serve as the corresponding driving signal $S_2$/$S_4$. In other words, the driving signal $S_2$/$S_4$ is asserted. Moreover, when one shift registering signal is not asserted (at a high level), the switch element 1005 and 1006 of the corresponding switch circuit are turned off, and the switch element 1007 thereof is turned on, so that the corresponding switch circuit outputs the voltage signal of the ground terminal GND to the respective node N110 to serve as the corresponding driving signal. In other words, the corresponding driving signal is not asserted.

According to the scan driving device 1000 in FIG. 10, the switch circuits $1003_1$-$1003_N$ share one buffer unit 1002. Thus, the scan driving device 1000 occupies smaller area and may be applied in a display panel with a narrow border design. When the buffer unit 1002 having large driving capability is used, the required area occupied by the scan driving device 1000 is only minimally increased.

Figure 12:
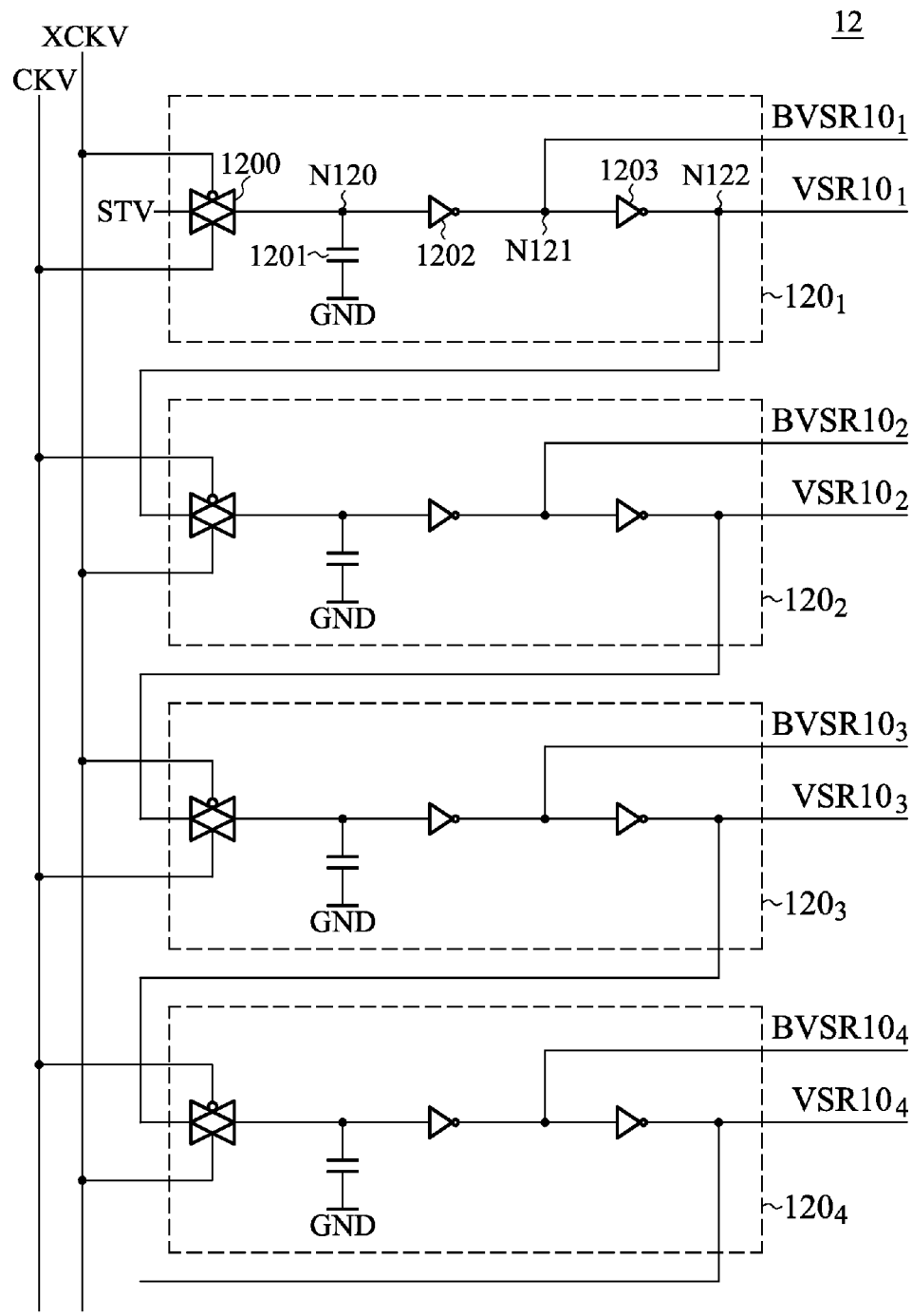
FIG. 12 shows an exemplary embodiment of shift register of the scan driving circuit in FIG. 10.

The shift register 1001 which generates the shift registering signals $VSR10_1$-$VSR10_4$ and the inverse shift registering signals $BVSR10_1$-$BVSR10_4$ can be implemented by several embodiments. Referring to FIG. 12, a shift register 12 generates the shift registering signals $VSR10_1$-$VSR10_4$ and the inverse shift registering signals $BVSR10_1$-$BVSR10_4$ which are provided to the switch circuits $1003_1$-$1003_4$. The shift register 12 comprises shift registering units $120_1$-$120_4$, and the shift registering units $120_1$-$120_4$ have the same circuit structure. In the following, the shift registering unit $120_1$ is given as example for the detailed description. The shift registering unit $120_1$ comprises a switch unit 1200, a capacitor 1201, and inverter units 1202 and 1203. An input terminal of the switch unit 1200 receives a start signal, and an output terminal thereof is coupled to a node N120. The switch unit 1200 is controlled by the clock signals CKV and XCKV, wherein the clock signal XCKV is inverse to the clock signal CKV. The capacitor 1201 is coupled between the node N120 and the ground terminal GND. An input terminal of the inverter unit 1202 is coupled to the node N120, and an output terminal thereof is coupled to a node N121. The inverter unit 1202 generates the corresponding inverse shift registering signals $BVSR10_1$ at the node N121. An input terminal of the inverter unit 1203 is coupled to the node N121, and an output terminal thereof is coupled to a node N122. The inverter unit 1203 generates the corresponding shift registering signals $VSR10_1$ at the node N122 Referring to FIG. 12, except for the shift registering signal $VSR10_4$ generated by the shift registering unit $120_4$, the shift registering signals $VSR10_1$-$VSR10_3$ generated by the shift registering units $120_1$-$120_3$ serve as the start signals of the next shift registering units $120_2$-$120_4$ respectively. The shift registering unit $120_1$ receives a signal STV to serve as its start signal.

The shift registering signal $VSR10_1$ generated by the shift registering unit $120_1$ is provided to the control terminals of the switch elements 1005 and 1007 of the switch circuit $1003_1$ as shown in FIG. 10 and the inverse shift registering signal BVSR10$_1$ is provided to the control terminal of the switch element 1006 of the switch circuit 1003$_1$. The shift registering units 120$_2$-120$_4$ perform the same operation as the shift registering unit 120$_1$.

Figure 13:
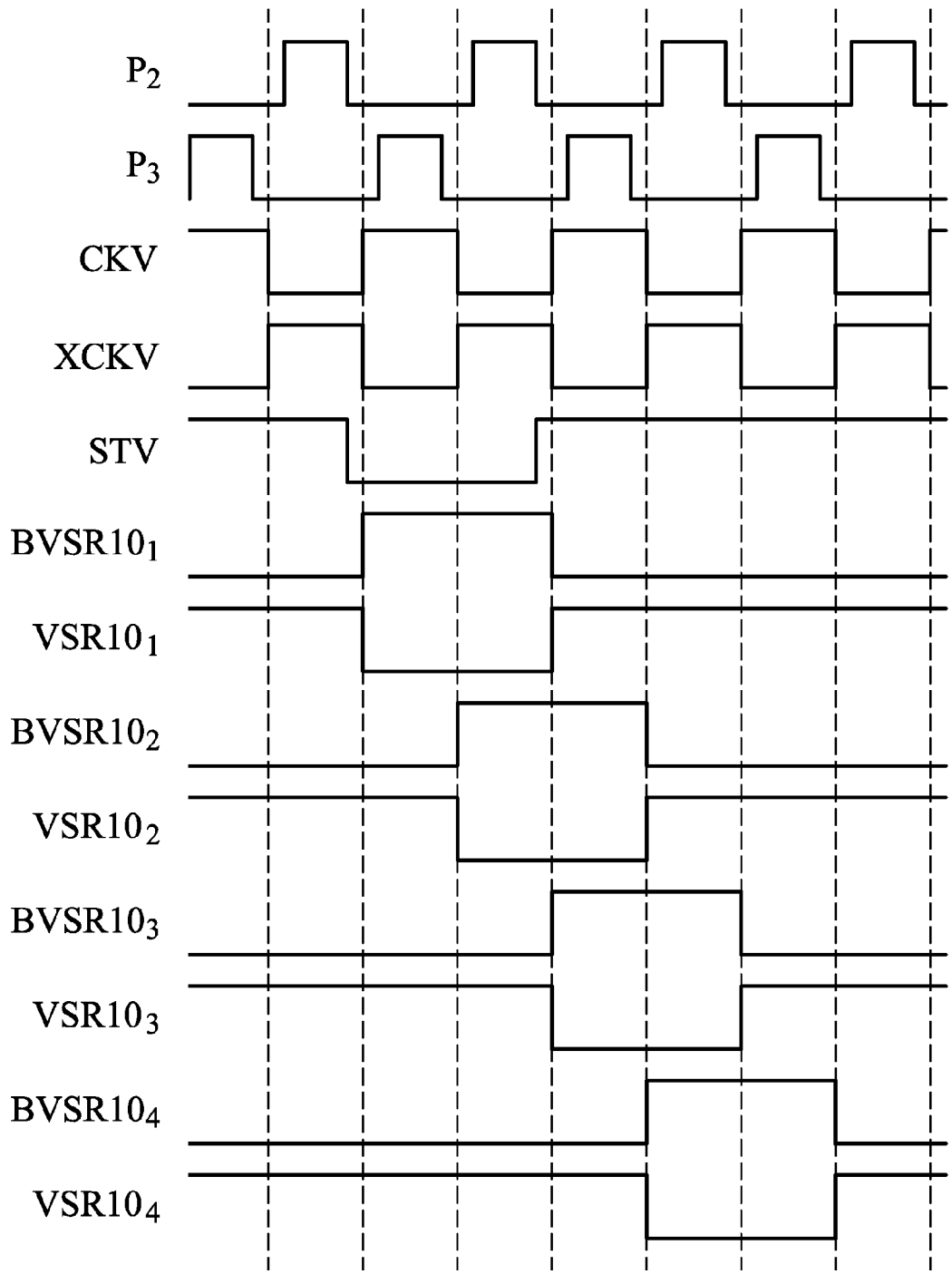
FIG. 13 is a signal timing chart of the shift register in FIG. 12.

FIG. 13 is a signal timing chart of the shift register 12 in FIG. 12. In order to clearly show the relationship between the shift registering signals VSR10$_1$-VSR10$_4$ and the inverse shift registering signals BVSR10$_1$-BVSR10$_4$ generated by the shift register 12 and the driving signals S$_1$-S$_4$ generated by the switch circuits 1003$_1$-1003$_4$, the waveforms of the input signals P2 and P3 are presented in FIG. 13 to correlate with the signal timing chart of FIG. 11.

Figure 14:
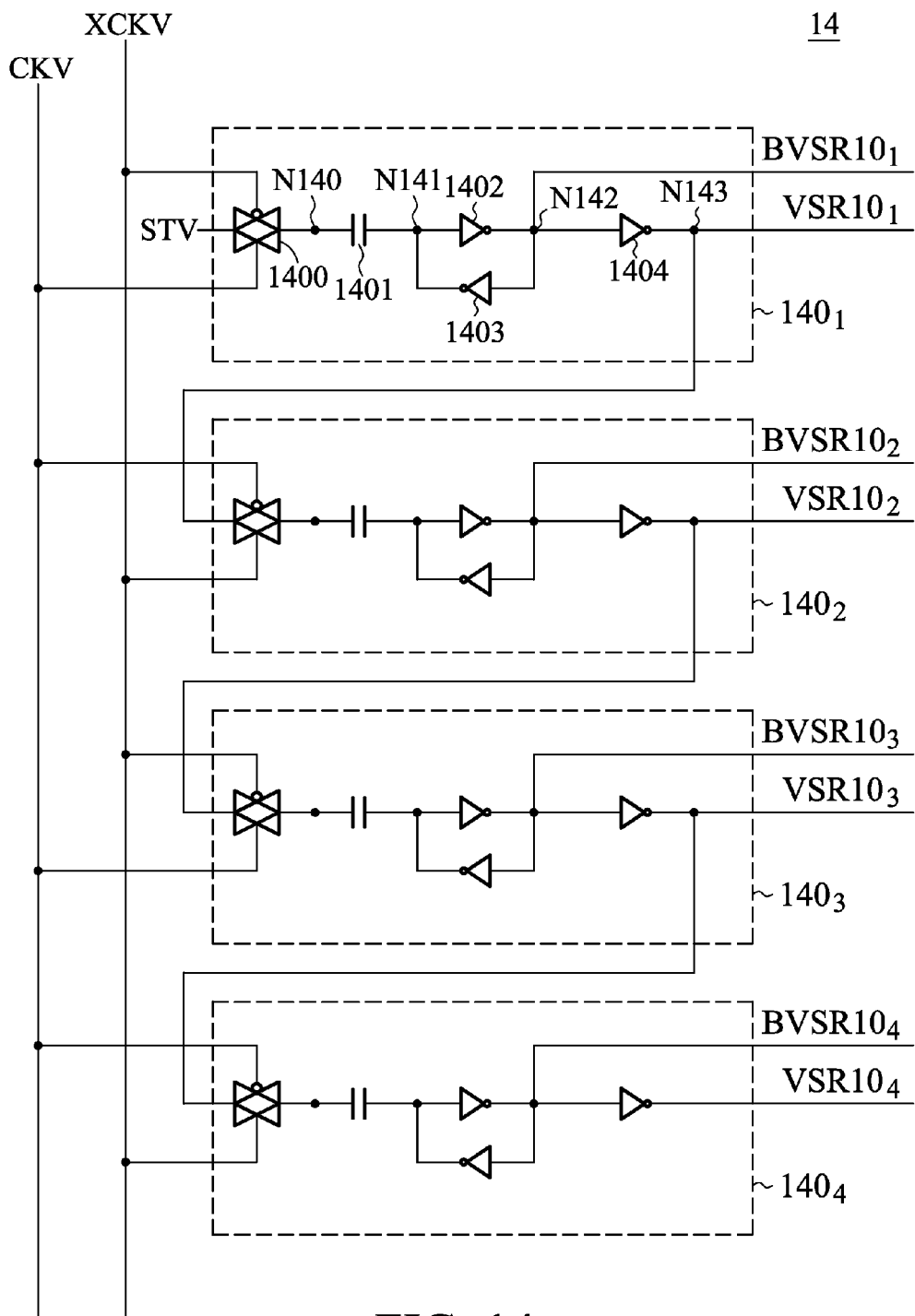
FIG. 14 shows another exemplary embodiment of shift register of the scan driving circuit in FIG. 10.

FIG. 14 shows another exemplary embodiment of a shift register for the scan driving device 1000 of FIG. 10. Referring to FIG. 14, a shift register 14 generates the shift registering signals VSR10$_1$-VSR10$_4$ and the inverse shift registering signals BVSR10$_1$-BVSR10$_4$ which are provided to the switch circuits 1003$_1$-1003$_4$. The shift register 14 comprises shift registering units 140$_1$-140$_4$, and the shift registering units 140$_1$-140$_4$ have the same circuit structure. In the following, the shift registering unit 140$_1$ is given as example for the detailed description. The shift registering unit 140$_1$ comprises a switch unit 1400, a capacitor 1401, and inverter units 1402-1404. An input terminal of the switch unit 1400 receives a start signal, and an output terminal thereof is coupled to a node N140. The switch unit 1400 is controlled by the clock signals CKV and XCKV, wherein the clock signal XCKV is inverse to the clock signal CKV. The capacitor 1401 is coupled between the node N140 and a node N141. An input terminal of the inverter unit 1402 is coupled to the node N141, and an output terminal thereof is coupled to a node N142. The inverter unit 1402 generates the corresponding inverse shift registering signals BVSR10$_1$ at the node N142. An input terminal of the inverter unit 1403 is coupled to the node N142, and an output terminal thereof is coupled to a node N141. An input terminal of the inverter unit 1404 is coupled to the node N142, and an output terminal thereof is coupled to an output node N143. The inverter unit 1404 generates the corresponding shift registering signals VSR10$_1$ at the output node N143 Referring to FIG. 14, except for the shift registering signal VSR10$_4$ generated by the shift registering unit 140$_4$, the shift registering signals VSR10$_1$-VSR10$_3$ generated by the shift registering units 140$_1$-140$_3$ serve as the start signals of the next shift registering units 140$_2$-140$_4$ respectively. The shift registering unit 140$_1$ receives a signal STV to serve as its start signal.

The shift registering signal VSR10$_1$ generated by the shift registering unit 140$_1$ is provided to the control terminals of the switch elements 1005 and 1007 of the switch circuit 1003$_1$ as shown in FIG. 10 and the inverse shift registering signal BVSR10$_1$ is provided to the control terminal of the switch element 1006 of the switch circuit 1003$_1$. The shift registering units 140$_2$-140$_4$ perform the same operation as the shift registering unit 140$_1$.

The signal timing chart of the shift register 14 in FIG. 14 is referred to as the signal timing chart in FIG. 13.

Figure 15:
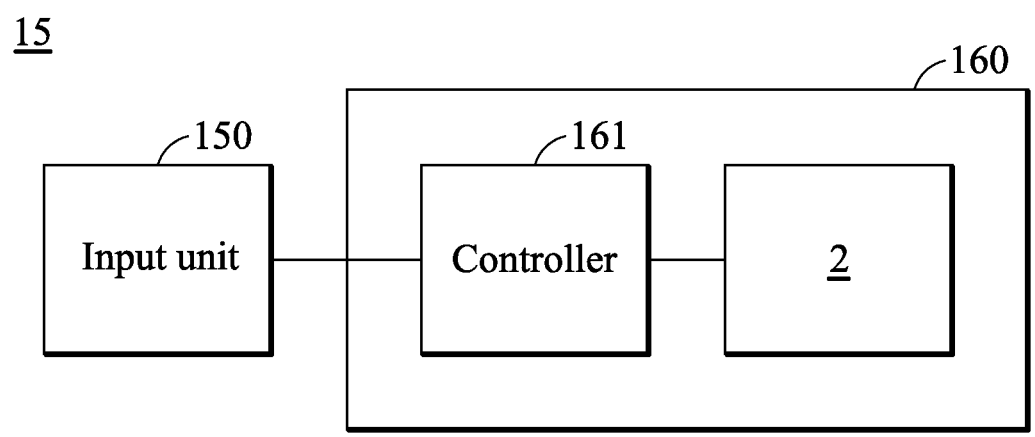
FIG. 15 shows another exemplary embodiment of an electronic system.

FIG. 15 shows an exemplary embodiment of an electronic system. An electronic system 15 can be a personal digital assistant (PDA), a digital camera, a notebook computer, a tablet computer, a cellular phone, a projector, an electronic book, a digital photo frame, a television, an automotive displayer, or a portable DVD displayer. Generally, the electronic system 15 comprises an input unit 150 and a display device 160. The input unit 150 is coupled to the display device 160 and provides input signals (such as image signals) to the display device 160. The display device 160 comprises a controller 161 and the display panel 2 of FIG. 2. The display panel 2 comprises the scan driving device 3 of FIG. 3 or the scan driving device 1000 of FIG. 10. The controller 161 receives the input signals from the input unit 150. The controller 161 is coupled to the display panel 2 and provides control signals (such as start pulse signals) or image data to the display panel 2.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A driving device for outputting a plurality of driving signals which are sequentially asserted to a display array, comprising:
   a shift register comprising a plurality of stages of shift registering units coupled in series, wherein the shift registering units respectively generate a plurality of shift registering signals, and the shift registering signals are sequentially asserted;
   a buffer unit for receiving at least one input signal, wherein the at least one input signal is periodically asserted, and the buffer unit outputs the at least one input signal; and
   a plurality of switch circuits directly connected to the shift registering units to receive the shift registering signals, respectively;
   wherein, all of the switch circuits are coupled to the buffer unit to receive the at least one input signal, and the switch circuits sequentially output the at least one input signal to serve as the driving signals for the display array according to the assertion of the shift registering signals; and
   wherein each of the switch circuits comprises:
   a first switch element having a control terminal receiving the corresponding shift registering signal, a first terminal receiving the first input signal, and a second terminal coupled to a first node;
   a second switch element having a control terminal receiving the corresponding shift registering signal, a first terminal coupled to the first node, and a second terminal coupled to a ground terminal; and
   a third switch element having a control terminal receiving an inverse shift registering signal, a first terminal receiving the first input signal, and a second terminal coupled to the first node, wherein the inverse shift registering signal is inverse to the corresponding shift registering signal;
   wherein the first switch element and the second switch element are separately turned on, the first switch element and the third switch element are simultaneously turned on, and the corresponding driving signal is generated at the first node.

2. The driving device as claimed in claim 1, wherein the buffer unit receives a first input signal and outputs the first input signal, all of the switch circuits receive the first input signal, and the switch circuits are sequentially turned on to output the first input signal to serve as the driving signals according to the assertion of the shift registering signals.

3. The driving device as claimed in claim 1, wherein the buffer unit comprises:
   a first buffer element for receiving a first input signal and outputting the first input signal; and
   a second buffer element for receiving a second input signal and outputting the second input signal;

wherein the switch circuits corresponding to the odd stages of the shift registering units receives the first input signal and are sequentially turned on to output the first input signal to serve as the driving signals according to the assertion of the corresponding shift registering signals; and wherein the switch circuits corresponding to the even stages of the shift registering units receives the second input signal and are sequentially turned on to output the second input signal to serve as the driving signals according to the assertion of the corresponding shift registering signals.

4. The driving device as claimed in claim 3, wherein each of the shift registering units comprises:
  a first switch unit having an input terminal receiving a start signal and an output terminal coupled to a second node and controlled by a first clock signal and a second clock signal; wherein the second clock signal is inverse to the first clock signal;
  a capacitor coupled between the second node and the ground terminal;
  a first inverter unit having an input terminal coupled to the second node and an output terminal coupled to a third node, wherein the first inverter unit generates the corresponding inverse shift registering signal at the third node; and
  a second inverter unit having an input terminal coupled to the third node and an output terminal coupled to an output node and generating the corresponding shift registering signal at the output node, wherein the second inverter unit generates the corresponding shift registering signal to serve as the start signal of the next shift registering unit.

5. The driving device as claimed in claim 3, wherein each of the shift registering units comprises:
  a first switch unit having an input terminal receiving a start signal and an output terminal coupled to a second node and controlled by a first clock signal and a second clock signal; wherein the second clock signal is inverse to the first clock signal;
  a capacitor coupled between the second node and a third node;
  a first inverter unit having an input terminal coupled to the third node and an output terminal coupled to a fourth node, wherein the first inverter unit generates the corresponding inverse shift registering signal at the fourth node;
  a second inverter unit having an input terminal coupled to the fourth node and an output terminal coupled to the third node; and
  a third inverter unit having an input terminal coupled to the fourth node and an output terminal coupled to an output node and generating the corresponding shift registering signal at the output node, wherein the third inverter unit generates the corresponding shift registering signal to serve as the start signal of the next shift registering unit.

6. A display panel comprising:
  a display array;
  a scan driving device comprising a driving unit as claimed in claim 1 for generating a plurality of driving signals and providing the driving signals to the display array through a plurality of scan lines, wherein the driving signals are sequentially asserted; and
  a data driving circuit for providing data signals to the display array through a plurality of data lines.

7. A display device comprising:
  a display panel as claimed in claim 6; and
  a controller coupled to the display panel.

8. An electronic system comprising:
  a display device as claimed in claim 7; and
  an input unit coupled to the display device.

9. The electronic system as claimed in claim 8, wherein the electronic system is a personal digital assistant (PDA), a digital camera, a notebook computer, a tablet computer, a cellular phone, a projector, an electronic book, a digital photo frame, a television, an automotive displayer, or a portable DVD displayer.

10. The driving device as claimed in claim 1, wherein each of the shift registering units comprises:
  a first switch unit having an input terminal receiving a start signal and an output terminal coupled to a second node and controlled by a first clock signal and a second clock signal, wherein the second clock signal is inverse to the first clock signal;
  a first inverter unit having an input coupled to the second node and an output terminal coupled to a third node;
  a capacitor coupled between the second node and the ground terminal;
  an output unit, coupled to the third node and an output node, for generating the corresponding shift registering signal at the output node; and
  a second inverter unit having an input terminal coupled to the third node and an output terminal generating an output signal;
  wherein the second inverter unit generates the output signal to serve as the start signal of the next shift registering unit.

11. The driving device as claimed in claim 10, wherein the output unit comprises:
  a second switch unit having an input terminal coupled to the third node and an output terminal coupled to a fourth node and controlled by the output signal generated by the previous shift registering unit and the output signal generated by the next shift registering unit;
  a transistor having a gate receiving the output signal generated by the next shift registering unit, a drain coupled to the fourth node, and a source coupled to the ground terminal, wherein the corresponding inverse shift registering signal is generated at the fourth node; and
  a third inverter unit, coupled between the fourth node and the output node, for receiving the inverse shift registering signal and generating the corresponding shift registering signal at the output node.

12. The driving device as claimed in claim 1,
  wherein in the switch circuits corresponding to the odd stages of the shift registering units, the first terminals of the first switch elements and the first terminals of the third switch elements receive the first input signal;
  wherein in the switch circuits corresponding to the even stages of the shift registering units, the first terminals of the first switch elements and the first terminals of the third switch elements receive the second input signal.

13. The driving device as claimed in claim 12, wherein each of the shift registering units comprises:
  a first switch unit having an input terminal receiving a start signal and an output terminal coupled to a second node and controlled by a first clock signal and a second clock signal, wherein the second clock signal is inverse to the first clock signal;
  a first inverter unit having an input coupled to the second node and an output terminal coupled to a third node;
  a capacitor coupled between the second node and the ground terminal;

an output unit, coupled to the third node and an output node, for generating the corresponding shift registering signal at the output node; and a second inverter unit having an input terminal coupled to the third node and an output terminal generating an output signal;

wherein the second inverter unit generates the output signal to serve as the start signal of the next shift registering unit.

14. The driving device as claimed in claim 13, wherein the output unit comprises:

a second switch unit having an input terminal coupled to the third node and an output terminal coupled to a fourth node and controlled by the output signal generated by the previous shift registering unit and the output signal generated by the next shift registering unit;

a transistor having a gate receiving the output signal generated by the next shift registering unit, a drain coupled to the fourth node, and a source coupled to the ground terminal, wherein the corresponding inverse shift registering signal is generated at the fourth node; and a third inverter unit, coupled to the fourth node, for receiving the inverse shift registering signal and generating the corresponding shift registering signal at the output node.

15. The driving device as claimed in claim 13, wherein the output unit comprises:

an NAND gate having a first input terminal coupled to the third node, a second input terminal coupled to the third node of the pervious shift registering unit, and an output terminal generating the corresponding shift registering signal; and a third inverter unit for receiving the shift registering signal and generating the corresponding inverse shift registering signal.

16. The driving device as claimed in claim 12, wherein each of the shift registering units comprises:

a first switch unit having an input terminal receiving a start signal and output terminal coupled to a second node and controlled by a first clock signal and a second clock signal, wherein the second clock signal is inverse to the first clock signal;

a capacitor coupled between the second node and a third node;

a first inverter unit having an input terminal coupled to the third node and an output terminal coupled to a fourth node, wherein the first inverter unit generates a control signal at the fourth node;

a second inverter unit having an input terminal coupled to the fourth node and an output terminal coupled to the third node;

an output unit, coupled between the fourth node and an output node, for generating the corresponding shift registering signal at the output node; and a third inverter unit having an input terminal coupled to the fourth node and an input terminal coupled to a fifth node, wherein the third inverter unit generates an output signal at the fifth node to serve as the start signal of the next shift registering unit.

17. The driving device as claimed in claim 16, wherein the output unit comprises:

a second switch unit having an input terminal coupled to the fifth node and an output terminal coupled to the output terminal and controlled by the control signal at the corresponding fourth node and the control signal at the fourth node of the next shift registering unit, wherein the second switch unit generates the corresponding shift registering signal at the output node;

a transistor having a gate receiving the control signal generated by the next shift registering unit, a drain coupled to the output node, and a source coupled to the ground terminal; and a third inverter unit, coupled to the output node, for generating the corresponding inverse shift registering signal.

18. The driving device as claimed in claim 16, wherein the output unit comprises:

an NAND gate for receiving the control signal at the corresponding fourth node and the control signal generated by the previous shift registering unit and generating the corresponding shift registering signal at the output node; and a third inverter unit for receiving the shift registering signal and generating the corresponding inverse shift registering signal.

* * * * *